(12) United States Patent
Nayak et al.

(10) Patent No.: US 7,655,991 B1
(45) Date of Patent: Feb. 2, 2010

(54) CMOS DEVICE WITH STRESSED SIDEWALL SPACERS

(75) Inventors: Deepak Kumar Nayak, Fremont, CA (US); Yuhao Luo, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 118 days.

(21) Appl. No.: 11/221,507

(22) Filed: Sep. 8, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/408; 257/327; 257/335; 257/336; 257/344; 257/900; 257/E29.266; 257/E29.267; 257/E29.268; 257/E29.269; 257/E29.278; 257/E29.279

(58) Field of Classification Search .......... 257/327, 257/336, 344, 408, 900, 335, E29.266, E29.267, 257/E29.268, E29.269, E29.278, E29.279
See application file for complete search history.

(56) References Cited

U.S. PATENT DOCUMENTS

| | | | |
|---|---|---|---|
| 4,985,744 A * | 1/1991 | Spratt et al. ............... | 257/370 |
| 5,650,340 A | 7/1997 | Burr et al. | |
| 5,696,012 A * | 12/1997 | Son ........................... | 438/231 |
| 5,989,986 A * | 11/1999 | Hsieh ........................ | 438/514 |
| 6,075,262 A * | 6/2000 | Moriuchi et al. ............ | 257/280 |
| 6,157,064 A * | 12/2000 | Huang ....................... | 257/344 |
| 6,177,319 B1 | 1/2001 | Chen | |
| 6,262,445 B1 * | 7/2001 | Swanson et al. ............ | 257/288 |
| 6,287,988 B1 | 9/2001 | Nagamine et al. | |
| 6,306,712 B1 * | 10/2001 | Rodder et al. ............... | 438/289 |
| 6,399,973 B1 | 6/2002 | Roberds | |
| 6,541,343 B1 | 4/2003 | Murthy et al. | |
| 6,563,152 B2 | 5/2003 | Roberds et al. | |
| 6,573,172 B1 | 6/2003 | En et al. | |
| 6,713,360 B2 * | 3/2004 | Jain et al. ................... | 438/306 |
| 6,743,684 B2 | 6/2004 | Liu | |
| 6,870,179 B2 | 3/2005 | Shaheed et al. | |
| 6,906,393 B2 * | 6/2005 | Sayama et al. .............. | 257/414 |
| 6,939,814 B2 | 9/2005 | Chan et al. | |
| 7,022,561 B2 | 4/2006 | Huang et al. | |
| 7,052,964 B2 | 5/2006 | Yeo et al. | |

(Continued)

OTHER PUBLICATIONS

Yuhao Luo, et al. "Strain-Silicon CMOS using Etch-Stop Layer and Method of Manufacture", U.S. Appl. No. 11/146,640, filed Jun. 7, 2005, 17pages, available from Xilinx Inc., 2100 Logic Drive, San Jose, CA 95124.

(Continued)

*Primary Examiner*—Ida M Soward
(74) *Attorney, Agent, or Firm*—Scott Hewett; John J. King

(57) ABSTRACT

Sidewall spacers on the gate of a MOS device are formed from stressed material so as to provide strain in the channel region of the MOS device that enhances carrier mobility. In a particular embodiment, the MOS device is in a CMOS cell that includes a second MOS device. The first MOS device has sidewall spacers having a first (e.g., tensile) type of residual mechanical stress, and the second MOS device has sidewall spacers having a second (e.g., compressive) type of residual mechanical stress. Thus, carrier mobility is enhanced in both the PMOS portion and in the NMOS portion of the CMOS cell.

3 Claims, 4 Drawing Sheets

U.S. PATENT DOCUMENTS

| | | | |
|---|---|---|---|
| 7,053,400 | B2 | 5/2006 | Sun et al. |
| 7,138,309 | B2 * | 11/2006 | Lee et al. .................... 438/197 |
| 7,193,254 | B2 * | 3/2007 | Chan et al. .................. 257/274 |
| 7,208,362 | B2 | 4/2007 | Chidambaram |
| 7,259,105 | B2 * | 8/2007 | Kim ........................... 438/724 |
| 7,265,419 | B2 * | 9/2007 | Minami ....................... 257/347 |
| 7,288,448 | B2 | 10/2007 | Orlowski et al. |
| 7,423,283 | B1 * | 9/2008 | Luo et al. ...................... 257/19 |
| 7,429,775 | B1 * | 9/2008 | Nayak et al. ................. 257/369 |
| 7,528,028 | B2 * | 5/2009 | Liang et al. .................. 438/199 |
| 2004/0104405 | A1 | 6/2004 | Huang et al. |
| 2005/0040460 | A1 * | 2/2005 | Chidambarrao et al. ..... 257/336 |
| 2005/0136606 | A1 * | 6/2005 | Rulke et al. .................. 438/305 |
| 2005/0156237 | A1 * | 7/2005 | Grudowski ................. 257/346 |
| 2005/0247986 | A1 * | 11/2005 | Ko et al. ...................... 257/411 |
| 2005/0260817 | A1 * | 11/2005 | Kim .......................... 438/299 |
| 2005/0266639 | A1 * | 12/2005 | Frohberg et al. ............ 438/257 |
| 2005/0285187 | A1 * | 12/2005 | Bryant et al. ................ 257/335 |
| 2006/0009041 | A1 * | 1/2006 | Iyer et al. .................... 438/724 |
| 2006/0014350 | A1 * | 1/2006 | Wang et al. .................. 438/293 |
| 2006/0189167 | A1 | 8/2006 | Wang et al. |
| 2006/0244074 | A1 * | 11/2006 | Chen et al. ................... 257/371 |
| 2006/0252194 | A1 * | 11/2006 | Lim et al. .................... 438/199 |
| 2006/0267106 | A1 * | 11/2006 | Chao et al. .................. 257/382 |
| 2007/0001217 | A1 * | 1/2007 | Chen et al. ................... 257/321 |
| 2007/0010073 | A1 * | 1/2007 | Chen et al. ................... 438/486 |
| 2007/0034963 | A1 * | 2/2007 | Sudo ........................... 257/369 |

OTHER PUBLICATIONS

Yuhao Luo, et al., "Semiconductor Device with Backfilled Isolation" U.S. Appl. No. 11/244,566, filed Oct. 6, 2005, 13 pages, available from Xilinx Inc., 2100 Logic Drive, San Jose, CA 95124.

T. Ghani et al., "A 90nm High volume Manufacturing Logic Technology Featuring Novel 45nm Gate Length Strained Silicon CMOS Transistors", IEEE, 2003, pp. 1-3, available from fahr.ghani@intel.com, or Intel Corporation (Santa Clara) Corporate Office, 2200 Mission College Blvd., Santa Clara, California 95052-8119.

Min Chin Chai, "90 nm Node CMOS Technology Comparison between Intel Corporation and Samsung Electronics", pp. 1-6, May 8, 2003, available from Intel Corporation (Santa Clara) Corporate Office, 2200 Mission College Blvd., Santa Clara, California 95052-8119.

Brand et al., "Intel's 0.25 Micron, 2.0Volts Logic Process Technology", pp. 1-9, available from Intel Corporation (Santa Clara) Corporate Office, 2200 Mission College Blvd., Santa Clara, California 95052-8119, Intel Technology Journal Q3'98.

B. P. R. Chidambaram et al., "35% Drive Current Imporvement from Recessed-SiGe Drain Extensions on 37 nm Gate Length PMOS", 2004 Sumposium on VLSI Technology Digest of Technical Papers, pp. 48-49, available from Texas Instruments, MS 3739, 13560 N. Central Expressway, Dallas, TX 75243.

Luo, Y. et al., "Enhancement of CMOS Performance by Process-Induced Stress", IEEE Transactions on Semiconductors Manufacturing, vol. 18, No. 1, Feb. 2005, pp. 63-68.

U.S. Appl. No. 11/095,814, Nayak et al.,"Method of Fabricating Strain-Silicon CMOS", filed Mar. 31, 2005, Xilinx, Inc. 2100 Logic Drive, San Jose, California 95124.

U.S. Appl. No. 11/221,507, Nayak, D.K. et al., "CMOS Device With Stressed Sidewall Spacers", filed Sep. 8, 2005, Xilinx Inc., 2100 Logic Drive, San Jose, CA 95124.

U.S. Appl. No. 12/200,851, filed Aug. 28, 2008, Luo et al. Xilinx, Inc. 2100 Logic Drive, San Jose, California.

U.S. Appl. No. 12/200,871, filed Aug. 28, 2008, Nayak et al., Xilinx, Inc. 2100 Logic Drive, San Jose, California.

U.S. Appl. No. 11/146,640, filed Jun. 7, 2005, Luo et al.

Pidin, S. et al., "A Novel Strain Enchanced CMOS Architecture Using Selectively Deposited High Tensile and High Compressive Silicon Nitride Films", Jan. 2004, pp. 1-4, available from IEEE, 3 Park Avenue, 17th Floor, New York, NY 10016-5997.

Thompson, S. et al., "A 90 nm Logic Technology Featuring 50nm Strained Silicon Channel Transistors, 7 Layor of Cu Interconnects, Low κ ILD and 1 um² SRAM Cell", 2002, pp. 1-4, available from IEEE, 3 Park Avenue, 17th Floor, New York, NY 10016-5997.

* cited by examiner

CMOS DEVICE WITH STRESSED SIDEWALL SPACERS

FIELD OF THE INVENTION

The present invention relates generally to semiconductor devices, and more particularly to transistors having improved mobility due to channel strain.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory or SRAM cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") transistor (e.g., a p-type MOS ("PMOS") transistor) paired with a second-conductivity-type MOS transistor (e.g., an n-type MOS ("NMOS") transistor). CMOS cells can hold a logic state while drawing only very small amounts of current.

It is generally desirable that MOS transistors, whether used in a CMOS cell or used individually, provide good conductivity between the source and the drain of the MOS transistor when operating voltage is applied to the gate of the MOS transistor. In other words, it is desirable that current flows through the channel between the source and the drain when the MOS transistor is turned on.

The amount of current flowing through the channel of an MOS transistor is proportional to the mobility of charge carriers in the channel. Increasing the mobility of the charge carriers increases the amount of current that flows at a given gate voltage. Higher current flow through the channel allows the MOS transistor to operate faster. One of the ways to increase carrier mobility in the channel of a MOS transistor is to produce strain in the channel.

There are several ways to create strain in the channel region. One approach is to form stressed materials, such as epitaxially grown SiGe, in the source and drain regions of a MOS transistor. Unfortunately, this technique uses process steps that are not part of a conventional CMOS process flow, resulting in longer manufacturing times, higher yield losses due to removing the wafer from the CMOS process flow for epitaxy, and high cost. Additionally, these techniques are often used on only one type (e.g., P-type) of MOS field effect transistor ("FET"). Both P-type and N-type MOS FETs are found in a CMOS cell.

In some applications, two techniques are used to provide one type of stress in the PMOS portion of a CMOS cell (such as compressive SiGe epitaxy in the source/drain regions) and a second type of stress in the NMOS portion (such as by providing a tensile capping layer). This approach adds yet even more complexity to the CMOS fabrication process. In some cases, the tensile capping layer overlies the compressive SiGe epitaxy, reducing its effectiveness.

One technique uses compressive contact etch stop layers ("CESL") in the PMOS portion of a CMOS cell, and a tensile CESL in the NMOS portion. FIG. 1 is a simplified cross section of a prior art CMOS cell 100 having an NMOS portion 102 and a PMOS portion 104 separated by isolation dielectric 106. A tensile CESL 108 overlies the NMOS portion 102, creating tensile strain in the channel region 110 beneath the gate 112. A compressive CESL 114 overlies the PMOS portion 104, creating compressive strain in the channel region 116 beneath the gate 118. Other details of the CMOS cell 100, such as gate/drain regions, are omitted for simplicity of illustration.

In order to achieve good electrical contacts in both the NMOS and PMOS portions of the CMOS cell 100, the contacts in both portions should open at the same time without damaging silicide. Two steps of contact etch would be very challenging because the contact barrier layer needs to be formed right after contact opening to form high quality contact. However, the tensile CESL 108 may etch very differently from the compressive CESL 114 in a contact etch process. The tight manufacturing tolerances of the contact etch process limit the types of materials and thicknesses of the two different CESLs, which limits the amount of strain produced by the CESLs.

It is desirable to provide a CMOS cell having enhanced mobility in both the PMOS and NMOS portions of the cell that avoids the disadvantages of the prior art.

SUMMARY OF THE INVENTION

A CMOS cell has stressed sidewall spacers that enhance carrier mobility in both the PMOS and NMOS portions of the CMOS cell. The basic material used for the sidewall spacers in the PMOS portion can be the same as, or different from, the material used for the sidewall spacers in the NMOS portion. In a particular embodiment, the same mask that is used to define the sidewall spacers in a conventional CMOS fabrication process is used to define tensile and compressive sidewall spacers in a CMOS cell.

DETAILED DESCRIPTION OF THE DRAWINGS

Figure 2A:
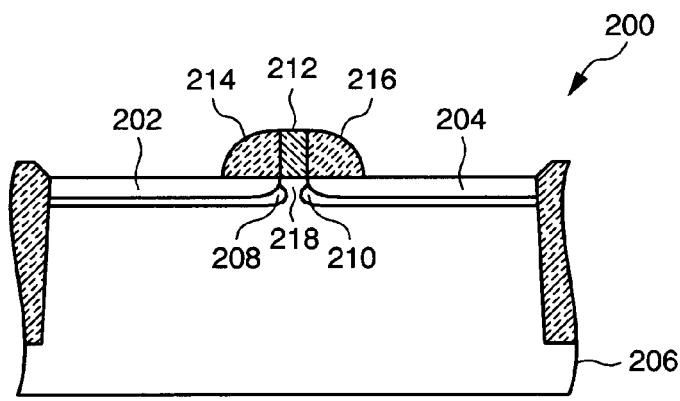
FIG. 2A is a simplified cross section of a partially fabricated MOS transistor according to an embodiment of the invention.

FIG. 2A is a simplified cross section of a partially fabricated MOS transistor 200 according to an embodiment of the invention. Lightly-doped drain ("LDD") regions 202, 204 have been formed in the silicon substrate 206, and a "Halo" implant has formed halo regions 208, 210 that extend slightly under the gate 212. The LDD and halo implantations are essentially self-aligned to the gate 212. Sidewall spacers 214, 216 have been formed on the sidewalls of the gate 212. The sidewall spacers 214, 216 have been formed to have a selective amount of mechanical stress, which induces strain in the channel region 218 of the MOS transistor 200 and increases carrier mobility.

For example, the MOS transistor 200 is an N-type FET and the sidewall spacers 214, 216 are silicon nitride ("SiN") having residual tensile stress. Alternatively, the MOS transistor 200 is a P-type FET and the sidewall spacers 214, 216 are SiN having residual compressive stress or silicon carbide ("SiC") having residual compressive stress. Other materials suitable for sidewall spacers and capable of providing mechanical stress to produce strain in the channel region of the FET to improve carrier mobility are alternatively used.

After forming the sidewall spacers 214, 216, the MOS transistor 200 is further processed to completion. A source/drain implant that is self-aligned to the sidewall spacers 214, 216 forms source/drain regions. This and subsequent steps for completion of the partially fabricated MOS transistor are well-known in the art, and a detailed description is therefore omitted.

Figure 2B:
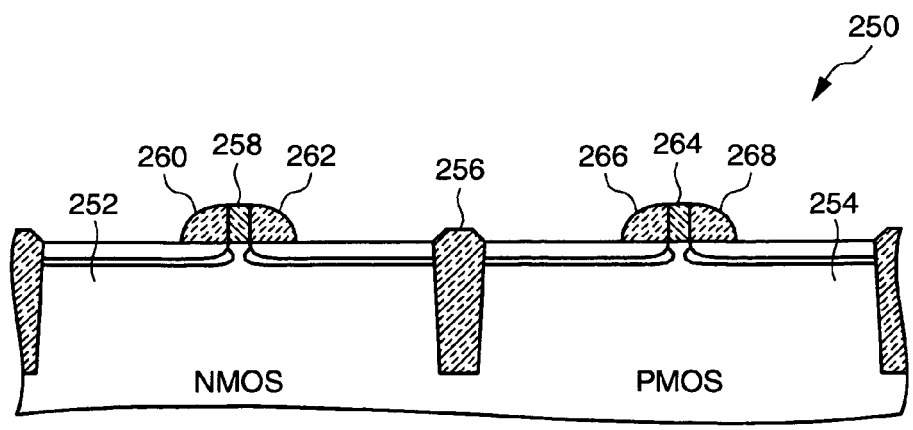
FIG. 2B is a simplified cross section of a partially fabricated CMOS cell according to an embodiment of the invention.

FIG. 2B is a simplified cross section of a partially fabricated CMOS cell 250 according to an embodiment of the invention. The CMOS cell 250 has an NMOS portion 252 and a PMOS portion 254 separated by isolation dielectric 256, which in this example is commonly known as "shallow trench isolation." The NMOS portion 252 has a first gate 258 (e.g., a polysilicon gate) with first sidewall spacers 260, 262 ('first sidewall spacer set'). Sidewall spacers are familiar to those of skill in the art of CMOS fabrication and provide self-alignment for the subsequent source/drain implant.

The first sidewall spacers 260, 262 are fabricated so as to have a first (e.g., tensile) type of residual mechanical stress. In an NMOS device, tensile strain is desired in the channel region (see FIG. 2A, ref. num. 218) to enhance carrier mobility. In a particular embodiment, the first sidewall spacers 260, 262 are SiN that was deposited so as to have residual tensile stress. This applies tension to the channel region, thus improving carrier mobility.

The PMOS portion 254 has a second gate 264 with second sidewall spacers 266, 268 ("second sidewall spacer set"). The second sidewall spacers 266, 268 are fabricated so as to have a second (e.g., compressive) type of residual mechanical stress. In a PMOS device, compressive strain is desired in the channel region to enhance carrier mobility. In a particular embodiment the second sidewall spacers 266, 268 are SiN that was deposited so as to have residual compressive stress. This applies compression to the channel region, thus improving carrier mobility. In an alternative embodiment, the sidewall spacers are SiC that has residual compressive stress. The CMOS cell is completed using CMOS fabrication techniques familiar to those of skill in the art, and a detailed description is therefore omitted.

Figure 3A:
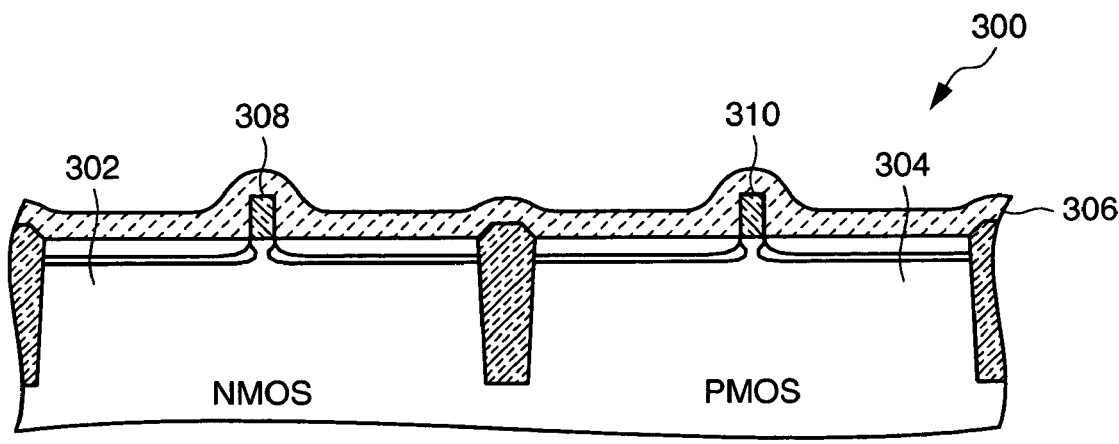
FIGS. 3A-3E are cross sectional views illustrating steps of forming a CMOS cell according to an embodiment of the invention.

FIGS. 3A-3E are cross sectional views illustrating steps of forming a CMOS cell according to an embodiment of the invention. FIG. 3A is a simplified cross section of a partially fabricated CMOS cell 300 suitable for fabricating into a CMOS cell according to an embodiment of the invention. For purposes of convenient discussion, the term "CMOS cell" is used to describe partially fabricated CMOS cells in a fabrication sequence, as well as to describe a completed CMOS cell.

The CMOS cell 300 has an NMOS portion 302 and a PMOS portion 304. A first sidewall spacer layer 306 overlies the CMOS cell 300, including a first gate 308 and a second gate 310. In a particular embodiment, the first sidewall spacer layer 306 is a SiN layer, which is material that is commonly used to form sidewall spacers in CMOS devices. However, the first sidewall spacer layer 306 is deposited under conditions that result in high residual mechanical stress. Depositing SiN with residual tensile stress is known in the art, and a detailed description of the various techniques for achieving such a stressed SiN layer is therefore omitted. Alternatively, other material suitable for sidewall spacer formation that provides residual mechanical stress sufficient to create strain in the channel of the device is used.

In this example, the first sidewall spacer layer 306 is a tensile layer and is used to form the sidewall spacers on the gate 308 of the NMOS portion 302 of the CMOS cell 300. In an alternative embodiment, the first sidewall spacer layer is a compressive layer and is used to form the sidewall spacers on the gate 310 of the PMOS portion 304 of the CMOS cell 300.

Figure 3B:
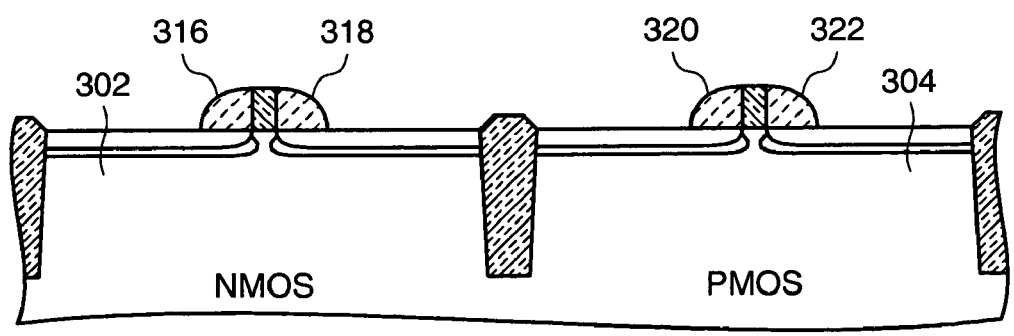

FIG. 3B shows the CMOS cell of FIG. 3A with sidewall spacers 316, 318, 320, 322 formed from the first sidewall spacer layer (see FIG. 3A, ref. num. 306). Essentially the same fabrication techniques that are used to form sidewall spacers in a conventional CMOS fabrication sequence are used to form the sidewall spacers 316, 318, 320, 322. Generally, an anisotropic etch is performed globally on the wafer and the spacers form on the side of the gate due to etch shadow effect.

The sidewall spacers 316, 318 on the NMOS portion 302 of the CMOS cell are covered with a layer of photoresist (not shown), but not the sidewall spacers 320, 322 on the PMOS portion 304. The photomask used for this step does not need to be a precision photomask; however, in a particular embodiment the N-well photomask is used. Precise alignment of the N-well photomask is not required because the resultant patterned photoresist need only to cover the sidewall spacers 316, 318 on the NMOS portion 302 in a subsequent etch step that removes the sidewall spacers 320, 322 from the PMOS portion 304. Then the photoresist is removed.

Figure 3C:
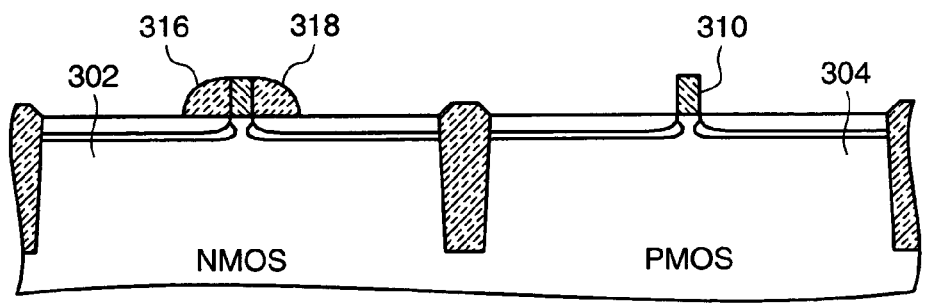
Figure 3D:
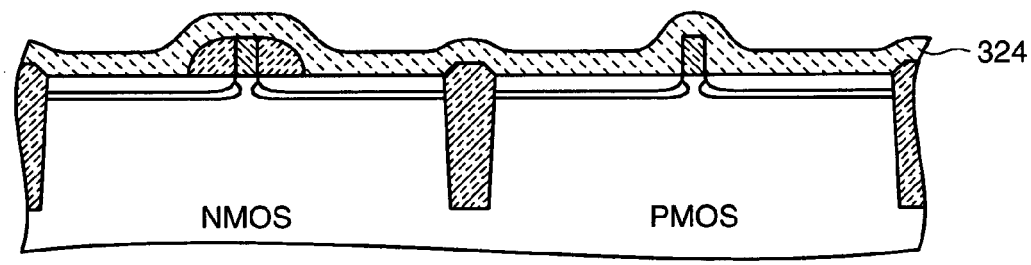

FIG. 3C shows the CMOS cell with the sidewall spacers 316, 318 on the NMOS portion 302. The sidewall spacers (compare with FIG. 3B, ref. nums. 320, 322) on the PMOS portion 304 have been removed. FIG. 3D shows the CMOS cell of FIG. 3C with a second sidewall spacer layer 324. In a particular embodiment, the second sidewall spacer layer 324 is a SiN layer deposited under conditions that result in high residual compressive stress. Depositing SiN with residual compressive stress is known in the art, and a detailed description of the various techniques for achieving such a stressed SiN layer is therefore omitted. Alternatively, the second sidewall spacer layer is SiC or other material.

Figure 3E:
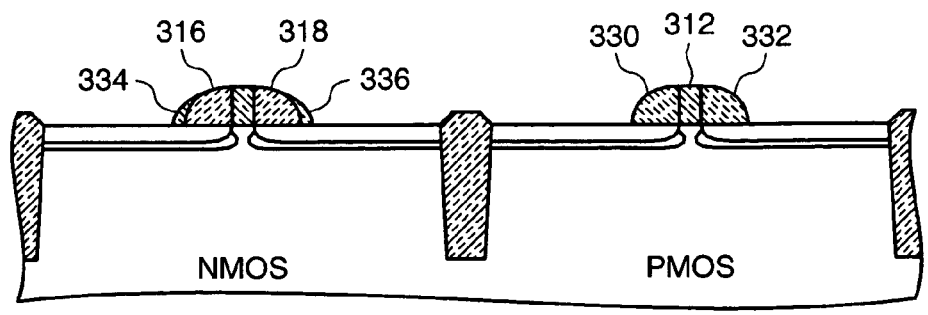

FIG. 3E shows the shows the CMOS cell of FIG. 3D with sidewall spacers 330, 332 formed from the second sidewall spacer layer (see FIG. 3F, ref. num. 324). Essentially the same fabrication techniques that are used to form sidewall spacers in a conventional CMOS fabrication sequence are used to form the second sidewall spacers 330, 332. As discussed in reference to the first sidewall spacers (see FIG. 3B, ref. nums. 316, 318), a global anisotropic etch is performed, and the second sidewall spacers 330, 332 form on the sidewalls of the gate electrode 312 due to etch shadow effects.

Residue 334, 336 from the second sidewall spacer layer (see FIG. 3D, ref. num. 324) may remain on the first sidewall spacers 316, 318; however, this residue does not cause a problem because, due to the shape of the existing spacer, the residue is very small and does not affect device performance. Alternatively, the first sidewall spacers are slightly narrowed in an earlier process step, such as an isotropic sidewall etch step, to account for the slight broadening resulting from the residue. Alternatively, the residue is removed by a wet etch process after photolithographicly defining the source/drain implant. In some embodiments, such as when the second sidewall spacer material etches significantly faster than the first sidewall spacer material during formation of the second sidewall spacers, there is essentially no residue.

In an embodiment, a source/drain implant is done using a first set of spacers (e.g., the "extra" sidewall spacers 320, 322 in FIG. 3B when the NMOS well is covered with photoresist), the first set of spacers are removed, and then a second set of spacers (e.g., 330, 332) are formed having a width selected to provide the desired stress. This allows optimizing the placement of the source/drain implant according to the first set of spacers, and then optimizing the residual strain according to the second set of spacers. For example, the second set of spacers is wider to provide greater stress without affecting the position of the source/drain extensions relative to the gate. Using separate sidewall spacer processes for NMOS and PMOS portions of a CMOS cell provides the flexibility to optimize the performance of each device by optimizing sidewall spacer width, shape and material in each portion of the CMOS cell.

A feature of the embodiment illustrated by FIGS. 3A-3E is that the same photomask used to define the PMOS and NMOS sidewall spacers in a conventional CMOS fabrication sequence is used. In alternative embodiments, different photomasks are used. For example, a first sidewall spacer photomask is used to define the first sidewall spacers, and a second sidewall spacer photomask is used to define the second sidewall spacers. Such an approach avoids having to remove the first sidewall spacer material from the second gate (see FIGS. 3C, 3D and associated written description) before forming the second sidewall spacers.

Figure 1:
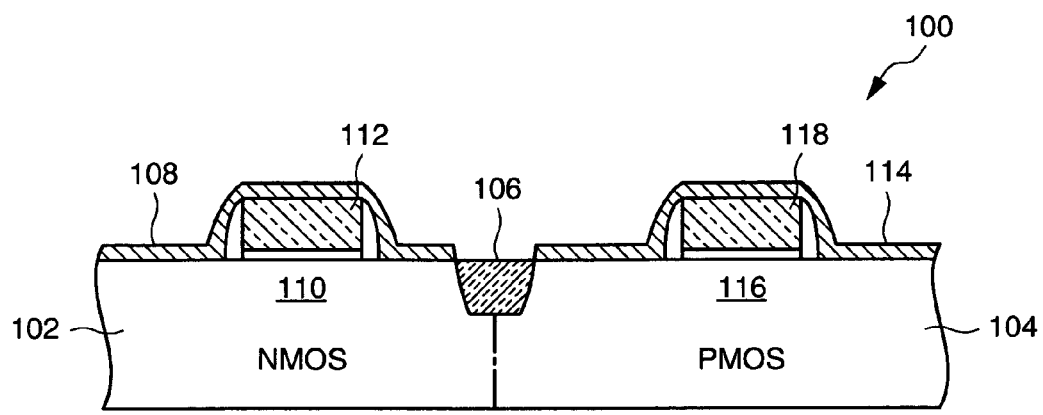
FIG. 1 is a simplified cross section of a prior art CMOS cell.

Unlike the dual CESL layers of FIG. 1, the first 316, 318 and second 330, 332 sidewall spacers may be made of different materials (e.g., SiN and SiC) because different etch steps, and hence different etch processes, may be used to define the first and second sidewall spacers. As explained above, the contact etch step is critical in that it is desirable to open the contacts in both the NMOS and PMOS portions of the cell simultaneously. This limits the types of materials and stresses that can be used to enhance carrier mobility in a CMOS device. A much greater selection of materials and stresses is possible with embodiments of the invention. This allows simultaneous optimization of the strain in both the NMOS and PMOS channels of the CMOS device. Providing strain in both NMOS and PMOS channels is particularly desirable for CMOS devices because of the wide applicability of CMOS in integrated circuits.

Figure 4:
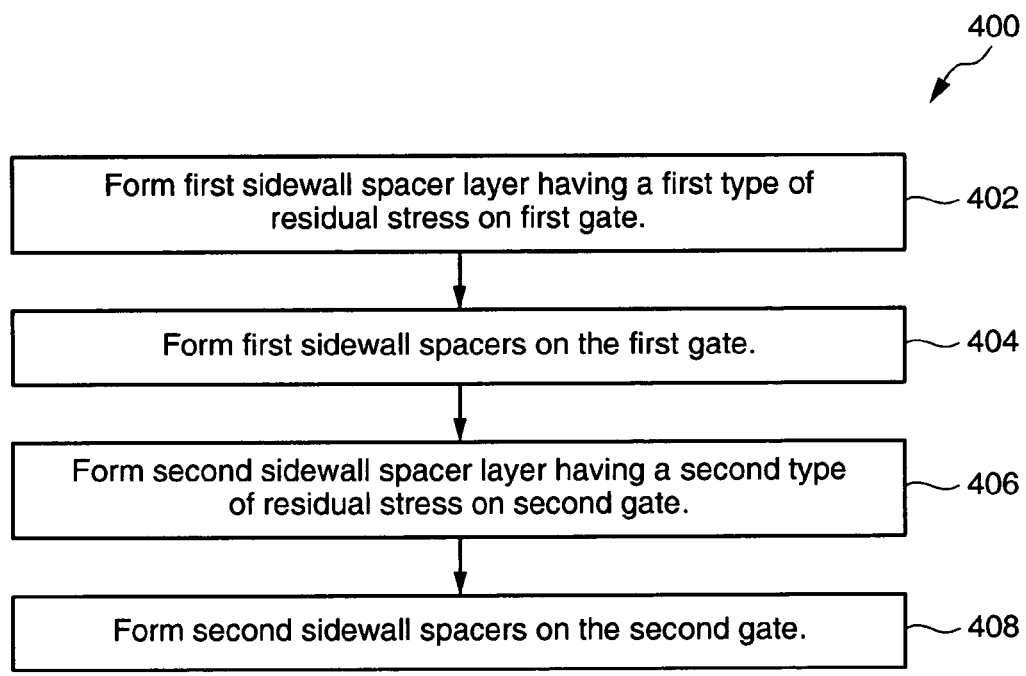
FIG. 4 is a flow chart of a method of fabricating a CMOS cell according to an embodiment of the invention.

FIG. 4 is a flow chart of a method 400 of fabricating a CMOS cell according to an embodiment of the invention. A first sidewall spacer layer having a first type of residual stress is formed on at least a first gate of the CMOS cell (step 402). First sidewall spacers are formed on at least the first gate (step 404). A second sidewall spacer layer having a second type of residual stress is formed on at least a second gate of the CMOS cell (step 406), and second sidewall spacers are formed on the second gate (step 408).

In a particular embodiment the first sidewall spacer layer is formed over the entire CMOS cell, and sidewall spacers are formed on the first and second gates. The sidewall spacers are removed from the second gate before depositing the second sidewall spacer layer. In a further embodiment the photo-mask used to define the first and second sidewall spacers is the photo-mask used to define sidewall spacers of conventional CMOS cells. This allows integration of the invention into the CMOS fabrication sequence without additional mask generation.

While the present invention has been described in connection with specific embodiments, variations of these embodiments will be obvious to those of ordinary skill in the art. For example, other materials may be used for the sidewall spacers, or other processing sequences may be followed. Therefore, the spirit and scope of the appended claims should not be limited to the foregoing description.

What is claimed is:

1. A semiconductor structure comprising:
   a first metal-oxide-semiconductor ("MOS") transistor of a first type having
      a first channel region,
      a first gate having a first sidewall and a second sidewall,
      a first sidewall spacer disposed on the first sidewall; and
      a second sidewall spacer disposed on the second sidewall, wherein the first sidewall spacer and the second sidewall spacer are made of a first selectively stressed material having a first type of stress so as to promote carrier mobility in the first channel region;
   a second MOS transistor of a second type, the first MOS transistor and the second MOS transistor forming a complementary MOS ("CMOS") cell, the second MOS transistor having
      a second channel region;
      a second gate having a third sidewall and a fourth sidewall;
      a third sidewall spacer disposed on the third sidewall; and a fourth sidewall spacer disposed on the fourth sidewall, wherein the third sidewall spacer and the fourth sidewall spacer are made of a second selectively stressed material having a second type of stress so as to promote carrier mobility in the second channel region; and residue of the second selectively stressed material on at least one of the first sidewall spacer and the second sidewall spacer, wherein the residue remains from an etching step forming the third sidewall spacer and the fourth sidewall spacer disposed on the second gate, and wherein one of the first type of stress and the second type of stress comprises a tensile stress and the other of the first type of stress and the second type of stress comprises a compression stress and the width of the first sidewall spacer and the second sidewall spacer are selected to account for the width of the second selectively stressed material on at least one of the first sidewall spacer and the second sidewall spacer.

2. The semiconductor structure of claim 1 wherein the first selectively stressed material comprises silicon nitride having residual tensile stress and the second selectively stressed material comprises silicon nitride having residual compressive stress.

3. The semiconductor structure of claim 1 wherein the first selectively stressed material has residual tensile stress and the second selectively stressed material comprises silicon carbide having residual compressive stress.

* * * * *

UNITED STATES PATENT AND TRADEMARK OFFICE
CERTIFICATE OF CORRECTION

PATENT NO. : 7,655,991 B1  Page 1 of 1
APPLICATION NO. : 11/221507
DATED : February 2, 2010
INVENTOR(S) : Nayak et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 264 days.

Signed and Sealed this

Thirtieth Day of November, 2010

David J. Kappos
*Director of the United States Patent and Trademark Office*